United States Patent [19]
Li

[11] Patent Number: 5,477,204
[45] Date of Patent: Dec. 19, 1995

[54] RADIO FREQUENCY TRANSFORMER

[75] Inventor: Richard C. Li, Plantation, Fla.

[73] Assignee: Motorola, Inc., Schaumburg, Ill.

[21] Appl. No.: 270,623

[22] Filed: Jul. 5, 1994

[51] Int. Cl.[6] .................................................. H01F 27/28
[52] U.S. Cl. ......................................... 336/200; 336/232
[58] Field of Search ...................................... 336/200, 232

[56] References Cited

U.S. PATENT DOCUMENTS

| | | | |
|---|---|---|---|
| 3,466,580 | 9/1969 | Bull | 336/200 |
| 4,369,557 | 1/1983 | Vandebult | 29/25.42 |
| 4,494,100 | 1/1985 | Stengel | 336/200 |
| 5,017,902 | 5/1991 | Yerman et al. | 336/200 X |
| 5,068,612 | 11/1991 | Auslander et al. | 336/200 X |
| 5,276,421 | 1/1994 | Boitard | 336/180 |
| 5,291,173 | 3/1991 | Yerman et al. | 336/183 |

Primary Examiner—Laura Thomas
Attorney, Agent, or Firm—M. Mansour Ghomeshi

[57] ABSTRACT

A transformer (100) includes a substrate (101) on which two substantially adjacent runners (124 and 126) are disposed. The two runners (124 and 126) have substantially the same width and the same length and run from one segment of the substrate to another forming two spirals. The spirals run in opposite directions thereby capturing the flux and preventing it from escaping from the substrate hence adding to the efficiency of the electromagnetic coupling. The insertion loss of the transformer (100) is minimized by the high dielectric constant of the substrate, the close proximity of the two runners (124 and 126), and the opposite direction of the two loops.

16 Claims, 3 Drawing Sheets

RADIO FREQUENCY TRANSFORMER

TECHNICAL FIELD

This invention is related in general to electronic devices and particularly to transformers and more particularly to radio frequency transformers.

BACKGROUND

Miniaturization of radio communication devices has made significant leaps in the last several years with new developments in integrated circuits (IC). These developments have assisted in the miniaturization of many components. Transformers have long resisted this trend and render the most miniaturization challenge to an electronic circuit designer. Transformers are used extensively in communication devices to provide for a variety of functions such as impedance transformation and isolation. Transformers are also used in the design of amplifiers and mixers for various of functions. The extensive use of transformers has put a dam on designers attempts to shrink the size of communication devices. Surface mount transformers have rendered some relief to this issue of size. However, at the cost of performance degradation, including insertion loss and bandwidth. It is therefore desired to have a transformer that is volumetrically efficient without the performance degradation of the prior art.

DETAILED DESCRIPTION OF THE PREFERRED EMBODIMENT

To combat the undesirably high height and large volume of transformers, the present invention utilizes a transformer that is as thin as the circuit carrying substrate used in electronic devices. By producing two concurrent loops formed by two substantially adjacent runners a transformer is created that enjoys a very wide bandwidth along with a very low insertion loss. These requirements are highly desirable in radio frequency applications, particularly amplifier applications were insertion loss is directly translated into power loss.

Figure 1:
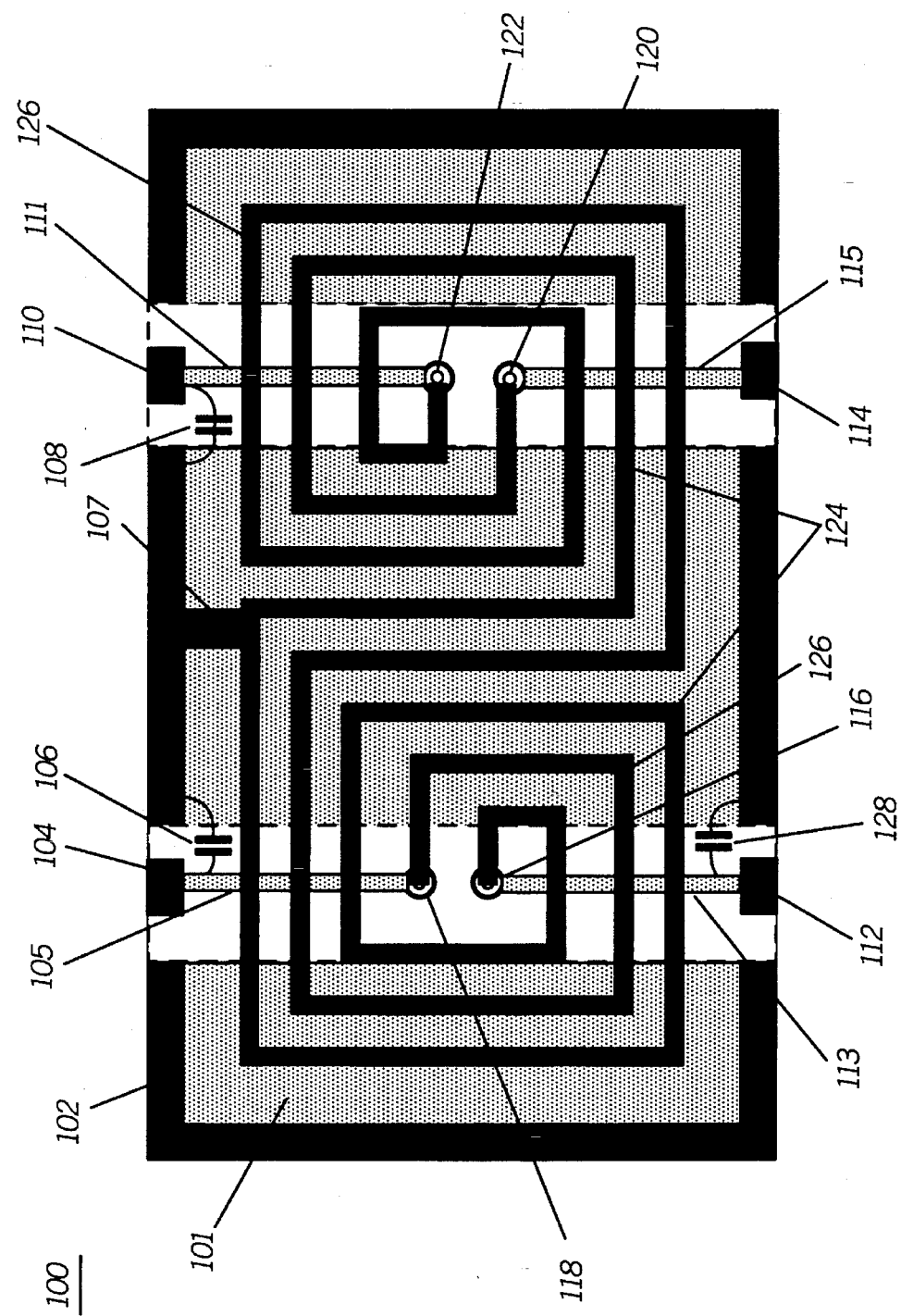
FIG. 1 shows a transformer in accordance with the present invention.

Referring to FIG. 1, a transformer 100 in accordance with the present invention is shown. The transformer 100 includes a flat substrate 101 such as alumina ceramic, which is electrically insulating and has a dielectric constant higher than air. The high dielectric constant of the substrate is highly desired in order to reduce the size of the transformer 100. The substrate 101 includes a top surface and a bottom surface. The top surface is shown to be the surface where runners 124 and 126 are disposed. The bottom surface is substantially plated to give the substrate 101 microstrip characteristics. The plated areas on the second surface are shown as being shaded. Surrounding the top surface is a ground runner 102 that connects to the bottom plated area.

The transformer 100 includes first and second substantially adjacent and substantially flat runners 124 and 126 having equal length and equal width. In the preferred embodiment, the width of 5 mills and lengths from 2500 to 5500 mills have produced satisfactory results. The length of the runners is dependent on the operating frequency of the transformer 100. In this embodiment, the length of the runners is chosen to be as dose to ½ the wavelength of the operating frequency as possible. This relation between the length and the operating frequency is desirable because the energy of the standing wave would be confined to the central area of the substrate 101. This confinement results in less leakage of energy hence minimum insertion loss. As it will be demonstrated later, the bandwidth of the transformer 100 may be changed by a plurality of bypass capacitors. The two runners 124 and 126 are disposed on the top surface of the substrate 101 substantially close to each other via well known micro strip techniques. The close proximity of the two runners enhances the electromagnetic coupling between them. The two runners 124 and 126 are looped to substantially form first and second spirals on first and second segments of the top surface. The two spirals flow in opposite direction of each other in order to contain the flux that may escape the surface of the runners. The opposite direction of the two spirals forces the flux induced by the first loop to return to the second loop and vice versa. In general, the two spirals collectively form an S shape double wounding that provides for additional containment of the electromagnetic flux. One runner spirals clockwise while the other spirals counter clockwise to form the S-shape configuration. The flux generated by the first loop is bent down into the second loop. Consequently, the energy is not scattered out of the substrate and remains therein thereby minimizing the insertion loss. Indeed, it is this significant feature that provide for a very low loss transformer.

The first runner 124 includes a first terminal (end) 118 which is coupled to port 104 of the transformer 100 via a runner 105 on the bottom surface of the substrate. A second terminal (end) 122 is connected to port 110 via a runner 111 on the bottom surface. Similarly, first and second ends 116 and 120 of the second runner 126 are connected to ports 112 and 114, respectively via runners 113 and 115 on the bottom surface. The runners 105, 111, 113, and 115 are shown with dotted areas to avoid unnecessary confusion. Capacitors 106, 108, and 128 couple ports 104, 110, and 112, respectively to ground pad 102. These capacitors provide a mechanism by which the bandwidth of the transformer 100 may be altered. In the preferred embodiment, the value of capacitors 106 and 108 are 5.6 pf and the value of capacitor 128 is 2.7 pf. These values provide the transformer 100 with the operating frequency band from UHF to 1.5 GHz.

In general, the transformer 100 is a double-line radio frequency balun (balanced/unbalanced) transformer and includes two intertwined loops. The loops are formed on the substrate 101 by circuit runners 124 and 126 that run substantially adjacent to each other. The runners run adjacent to each other from one side of the substrate to the other in a figure eight arrangement. This figure eight comprises two spirals that run in opposite direction in order to minimize the insertion loss of the transformer. A circuit runner is created by selectively metallizing each surface of the substrate in accordance with a desired pattern. It is noted that although the two coils have been shown to have equal numbers of turns it is readily understood that different number of turns may be used for step up and step down purposes.

Each coil of the transformer 100 is formed by one runner that wraps around itself to form a spiral in one segment of the substrate. The runner continues on to form a second spiral on a second segment of the substrate 101. The second runner follows the first runner from the first segment to the second segment thereby forming two additional spirals. The close proximity of the two runners provide for an efficient transfer of the electromagnetic flux from one runner (loop) to the other. In other words, the strong edge coupling between the first runner (primary wounding) and the secondary runner (secondary wounding) provides for the high efficiency of the transformer 100.

The word spiral as used herein is intended to encompass a broad class of structures which exhibit a clockwise or counterclockwise outwardly winding path beginning in a substantially centralized location in which each winding is successively longer than the previous winding. This definition is intended to embody generally rectangular, circular, polygonal, elliptical, and oval spirals as well as other irregular yet generally spiraling shapes. In the preferred embodiment, rectangular spirals are used to conserve space.

Figure 2:
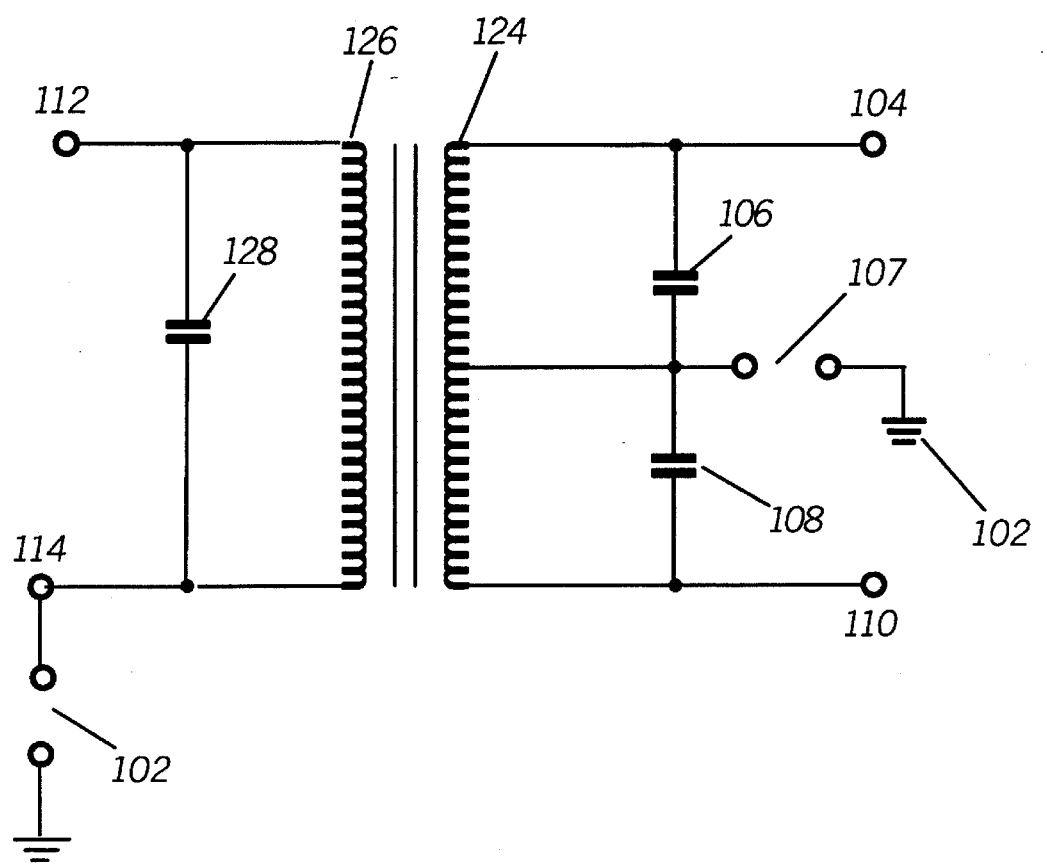
FIG. 2 shows an equivalent circuit of the transformer of FIG. 1.

Referring to FIG. 2, an equivalent circuit diagram of the transformer 100 in accordance with the present invention is shown. The two loops 124 and 126 are shown with bypass capacitors 128, 106, and 108. Loop 124 includes a center tap 107 that could be selectively coupled to ground 102 at a point between the first and second ends 116 and 120. The input port includes an input terminal 112 which may be coupled to a signal and a second terminal 114 which may be selectively coupled to ground. The grounding of the terminal 114 renders the input port unbalanced. The port may be balanced by removing the ground connection from terminal 114. The output ports 104 and 110 may be balanced or unbalanced with or without center tap depending on a particular application.

To fabricate the electronic component 100, a first circuit carrying substrate 101 is cut to a desired shape preferably square from a ceramic base material. The ceramic base material is chosen because of its high dielectric constant which is significantly higher than that of air. The substrate 101 which has a top surface is defined by a perimeter 102 which is grounded. First and second runners are formed via selective metalization of the top surface. The end terminals of the two runners are coupled to input and output ports via runners 105, 111, 113, and 115 on the bottom surface. With the exception of these runners, the bottom surface is plated to give the substrate a micro strip structure. Shaded areas show the plated areas of the bottom surface. The benefit of this structure is that it provides an effective shield for the transformer. In addition, a distributed capacitance is realized along the length of the transformer 100. Note that terminals 116, 118, 120, and 122 are transferred to the bottom surface via through holes and reach the border of the substrate 101 via runners 105, 111, 113, and 115, respectively.

Capacitors 106, 108, and 128 may be discrete components that could be soldered to the transformer right on the substrate 101. Ground tabs are used to allow for the selective coupling of terminals or the center tap to the ground 102. These tabs are simple metallized areas that are placed on the board connected to the frame 102. The removal of the tab 107 removes the center tab of the transformer 100. Disconnection from ground is accomplished via a manual or automatic cut in the runner.

Figure 3:
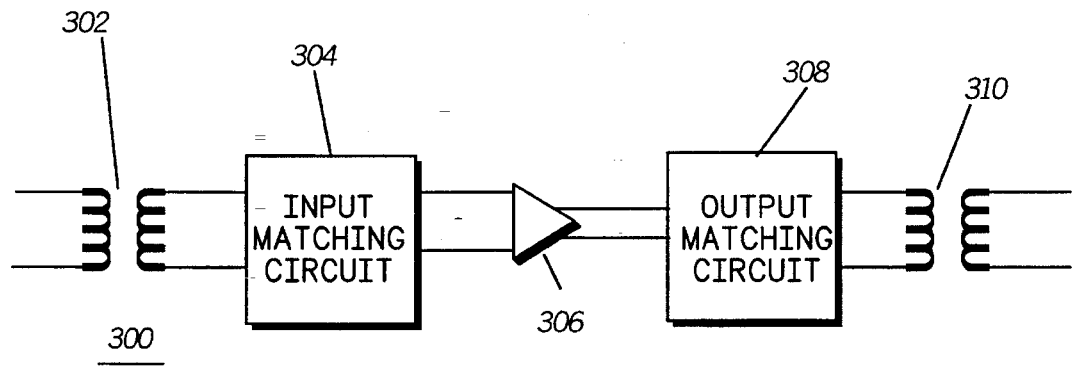
FIG. 3 shows a block diagram of an electronic device in accordance with the present invention.

Referring to FIG. 3, a schematic diagram of a push pull amplifier circuit 300 in accordance with the present invention is shown. The power amplifier 300 includes an input transformer 302, an input matching circuit 304, an RF power device 306, an output matching circuit 308 and an output transformer 310. The input and output transformers 302 and 310 are similar to device 100 in accordance with the present invention.

A signal coupled to the transformer 302 is matched to the power device 306. The output of the power device 306 is then matched with a transformer 310 through an output matching circuit 308. It can be appreciated that the substrate 101 may be enlarged to accommodate the matching circuits 304 and 308 and the power device 306 thereby significantly reducing the overall size of the device 300. This is highly significant as the area required for these two electrical devices is minimal as compared to the prior art thereby providing for the miniaturization of radio communication devices.

Figure 4:
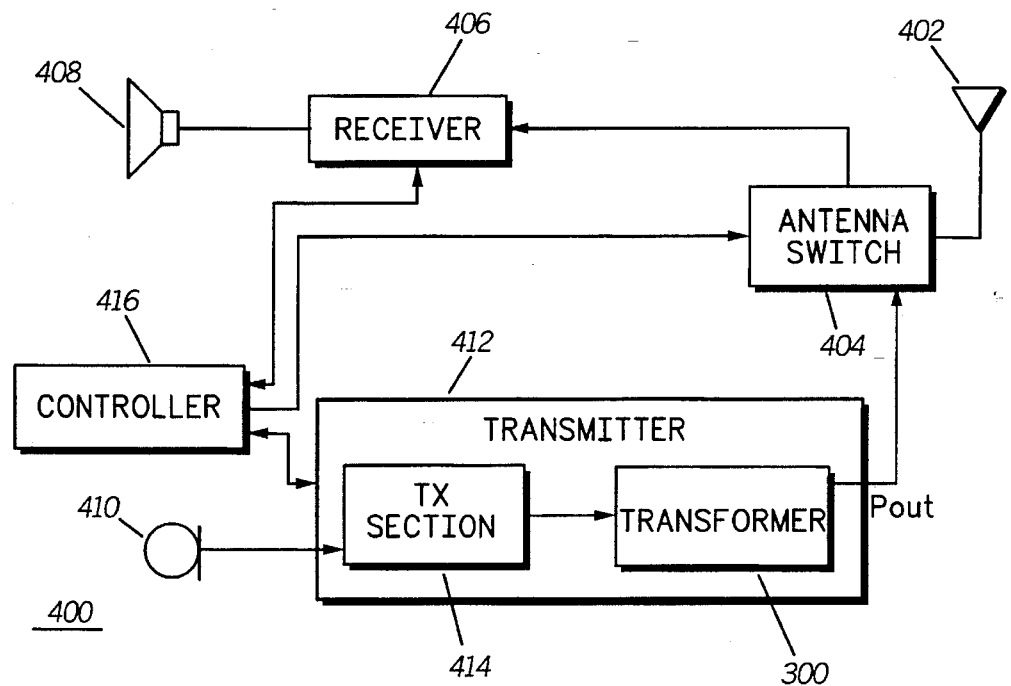
FIG. 4 shows a radio communication device in accordance with the present invention.

Referring to FIG. 4, a radio 400 is shown. Radio 400 comprises a receiver 406 used for receiving information signals, and a transmitter 412, used to transmit information. Transmitter 412 comprises the amplifier circuit 300 in accordance with the present invention. Also shown as part of transmitter 412 is section 414 which makes up conventional RF transmitter 412. Both receiver 406 and transmitter 412 are selectively coupled to antenna 402 via an antenna switch 404. The antenna switch 404 is controlled via a control line which is connected to a controller 416 that is used to control the operation of the radio 400. A speaker 408 is connected to receiver 406 for presentation of audio signals received by receiver 406. Microphone 410 is connected to transmitter 412, and allows voice messages to be transmitted via transmitter 412. Radio 400 is also capable of data transmissions, the method of transmission (voice/data) being dependent on the application the radio 400 is used for.

In summary, an electrical device includes a substrate on which a transformer is fabricated. The substrate includes substantially adjacent runners that run from one segment of the substrate to the next forming two opposite running spirals thereby creating two loops of the transformer. The spacing between the two runners is substantially small for maximum coupling of the electromagnetic flux. This narrow space provides for a strong mutual inductance between the loops which results in low insertion loss and wide bandwidth. A significant benefit of the transformer 100 is its low profile. This benefit is accomplished with no or minimum performance degradation. Due to its low profile and overall volumetric efficiency, the transformer 100 may be used in miniaturized electronic devices without sacrificing performance. The volume efficiency of the transformer 100 is yet another significant step toward making the next generation radio communication devices. In other words, it gets the designers of single chip radio communication devices one step closer to their goal.

The transformer 100 is suitable for such applications as push-pull amplifiers, balance mixers, and impedance transformation circuits. In particular, the application of the transformer 100 is amplifiers is highly advantageous due to its minimum insertion loss. This very low insertion loss provides a significant boost to the efficiency of the amplifier.

What is claimed is:

1. A transformer having an insertion loss, comprising:
    a substantially flat substrate of electrically insulating material having a major surface;
    first and second substantially adjacent runners disposed on the major surface, each runner forms a coil of the transformer and includes first and second terminals, the runners are looped to substantially form a first intertwined spiral on a first segment of the major surface and a second intertwined spiral on a second segment of the major surface, the first and second spirals are looped in opposite directions to minimize the insertion loss;

an input port coupled to the first and second terminals of the first runner; and an output port coupled to the first and second terminals of the second runner.

2. The transformer of claim 1, wherein the runners include substantially flat runners.

3. The transformer of claim 1, further including a substantially plated second surface.

4. The transformer of claim 1, wherein the runners include runners having substantially similar lengths.

5. The transformer of claim 4, wherein the lengths of the runners is substantially ½ the wavelength of a desired operating frequency.

6. The transformer of claim 1, wherein the runners include runners having substantially similar widths.

7. The transformer of claim 1, wherein the first and second spirals include rectangular spirals.

8. A double-line radio frequency balun transformer, comprising:

a substantially flat dielectric substrate having a top and a bottom surface;

a plurality of adjacent runners disposed on the top surface of the dielectric substrate to form a plurality of intertwined spirals looped in .opposite directions each runner includes first and second ends;

an input terminal coupled to the first end of the adjacent runners; and an output terminal coupled to the second end of the adjacent runners.

9. The transformer of claim 8, further including a center tap coupled to one of the runners at a point between the first and the second terminals.

10. The transformer of claim 8, wherein the second surface includes a substantially plated surface.

11. The transformer of claim 8, wherein the runners include substantially flat runners.

12. The transformer of claim 8, wherein the runners include runners having substantially similar lengths.

13. The transformer of claim 12, wherein the lengths of the runners is substantially ½ the wavelength of a desired operating frequency.

14. The transformer of claim 8, wherein the runners include runners having substantially similar widths.

15. The transformer of claim 8, wherein the plurality of adjacent runners include rectangular spirals.

16. A radio communication device, comprising:

an antenna;

a transmitter for transmitting a radio frequency signal and including an amplifier, the amplifier including a transformer for coupling an amplified signal to the antenna, the transformer having an insertion loss and comprising:

a substantially flat substrate of electrically insulating material having a major surface; and at least two substantially adjacent runners disposed on the first major surface, each runner having first and second terminals, the runners are looped to substantially form a first spiral on a first segment of the major surface and a second spiral on a second segment of the major surface, the first and second spirals are looped in opposite directions to minimize the insertion loss.

\* \* \* \* \*